(12) United States Patent
Tuominen et al.

(10) Patent No.: US 7,190,049 B2
(45) Date of Patent: Mar. 13, 2007

(54) NANOCYLINDER ARRAYS

(75) Inventors: Mark Tuominen, Shutosbury, MA (US); Joerg Schotter, Bielefeld (DE); Thomas Thurn-Albrecht, Freiburg (DE); Thomas P. Russell, Amherst, MA (US)

(73) Assignee: University of Massachusetts, Boston, MA (US)

( * ) Notice: Subject to any disclaimer, the term of this patent is extended or adjusted under 35 U.S.C. 154(b) by 871 days.

(21) Appl. No.: 09/814,891

(22) Filed: Mar. 22, 2001

(65) Prior Publication Data

US 2002/0055239 A1    May 9, 2002

Related U.S. Application Data

(60) Provisional application No. 60/191,340, filed on Mar. 22, 2000.

(51) Int. Cl.
*H01L 29/06* (2006.01)

(52) U.S. Cl. .................. 257/618; 977/720; 257/E51.04; 205/112

(58) Field of Classification Search ............... 257/618, 257/621; 977/700; 205/105, 112, 163, 173, 205/183, 205
See application file for complete search history.

(56) References Cited

U.S. PATENT DOCUMENTS

| | | | |
|---|---|---|---|
| 4,061,799 A | 12/1977 | Brewer | |
| 4,407,695 A | 10/1983 | Deckman et al. | |
| 4,801,476 A | 1/1989 | Dunsmuir et al. | |
| 5,581,091 A * | 12/1996 | Moskovits et al. | 257/9 |
| 5,622,668 A | 4/1997 | Thomas et al. | 264/289.3 |
| 5,629,353 A | 5/1997 | Steckle, Jr. et al. | 521/64 |
| 5,656,205 A | 8/1997 | Rabolt et al. | 252/582 |
| 5,747,180 A | 5/1998 | Miller et al. | 428/601 |
| 5,849,215 A * | 12/1998 | Gin et al. | 252/299.01 |
| 5,872,422 A * | 2/1999 | Xu et al. | 313/311 |
| 5,948,470 A | 9/1999 | Harrison et al. | |
| 6,093,636 A | 7/2000 | Carter et al. | 438/623 |
| 6,159,831 A | 12/2000 | Thrush et al. | 438/582 |
| 6,172,902 B1 * | 1/2001 | Wegrowe et al. | 365/158 |
| 6,180,222 B1 | 1/2001 | Schulz et al. | 428/317.9 |
| 6,185,961 B1 | 2/2001 | Tonucci et al. | 65/60.4 |
| 6,187,165 B1 | 2/2001 | Chien et al. | 205/118 |

(Continued)

FOREIGN PATENT DOCUMENTS

DE    WO 99/12994    *  3/1999

(Continued)

OTHER PUBLICATIONS

Amundson et al., "Alignment of Lamellar Block . . . ," Macromolecules, 27(22):6559-6570, 1994.

(Continued)

*Primary Examiner*—W. David Coleman
(74) *Attorney, Agent, or Firm*—Fish & Richardson P.C.

(57) ABSTRACT

Pathways to rapid and reliable fabrication of nanocylinder arrays are provided. Simple methods are described for the production of well-ordered arrays of nanopores, nanowires, and other materials. This is accomplished by orienting copolymer films and removing a component from the film to produce nanopores, that in turn, can be filled with materials to produce the arrays. The resulting arrays can be used to produce nanoscale media, devices, and systems.

18 Claims, 3 Drawing Sheets

U.S. PATENT DOCUMENTS

| | | | | |
|---|---|---|---|---|
| 6,204,202 | B1 | 3/2001 | Leung et al. | 438/781 |
| 6,231,744 | B1* | 5/2001 | Ying et al. | 205/324 |
| 6,262,466 | B1* | 7/2001 | Goerlach | 257/497 |
| 6,525,461 | B1* | 2/2003 | Iwasaki et al. | 313/495 |
| 6,538,367 | B1* | 3/2003 | Choi et al. | 313/309 |
| 6,592,991 | B1* | 7/2003 | Wiesner et al. | 428/404 |
| 6,781,166 | B2* | 8/2004 | Lieber et al. | 257/211 |

FOREIGN PATENT DOCUMENTS

| | | |
|---|---|---|
| WO | WO 98/48456 | 10/1998 |

OTHER PUBLICATIONS

Mansky et al., "Nanolithographic templates from . . . ," Appl. Phys. Lett., 68 (18):2586-2588, 1996.

Park et al., "Block Copolymer Lithography . . . ," Science, 276:1401-1404, 1997.

Mitchell et al., in "Template-Synthesized Nanomaterials in Electrochemistry," Electroanalytical Chemistry, A. J. Bard and I. Rubinstein, Eds., 21, (1999), 1-74.

Strijkers et al., in "Structure and Magnetization of Arrays of Electrodeposited Co Wires in Anodic Alumina," J. App. Phys., 86, (1999), 5141.

Han et al., in "Preparation of Noble Metal Nanowires Using Hexagonal Mesoporous Silica SBA-15," Chem. Mater., 12, (2000), 2068-2069.

Whitney et al., in "Fabrication and Magnetic Properties of Arrays of Metallic Nanowires," Science, 261, (1993), 1316.

* cited by examiner

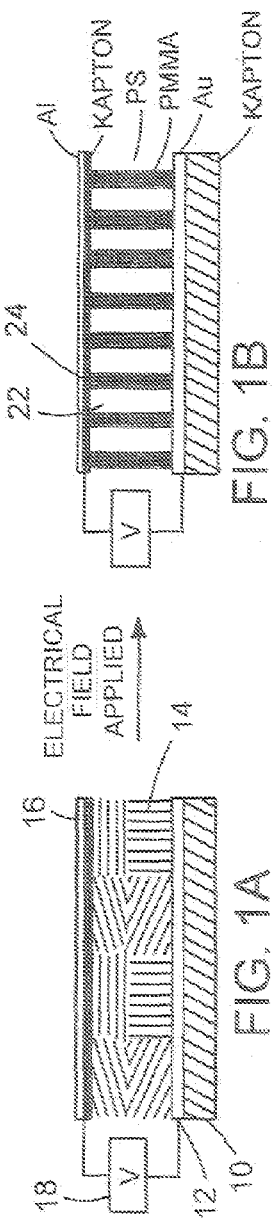
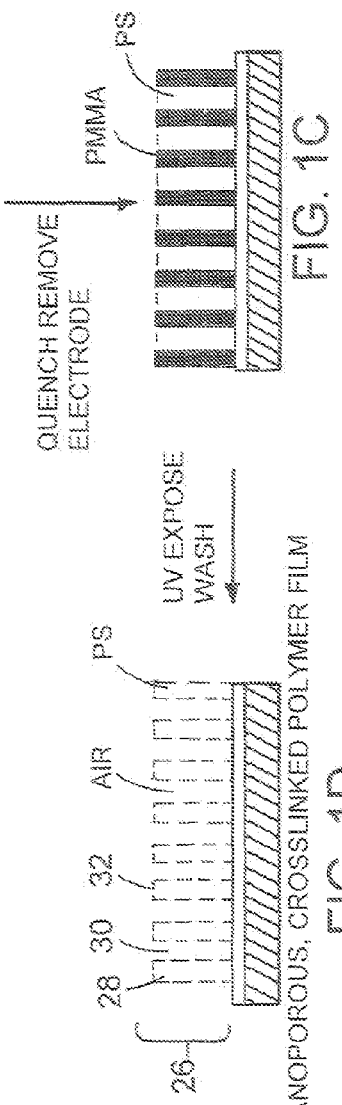
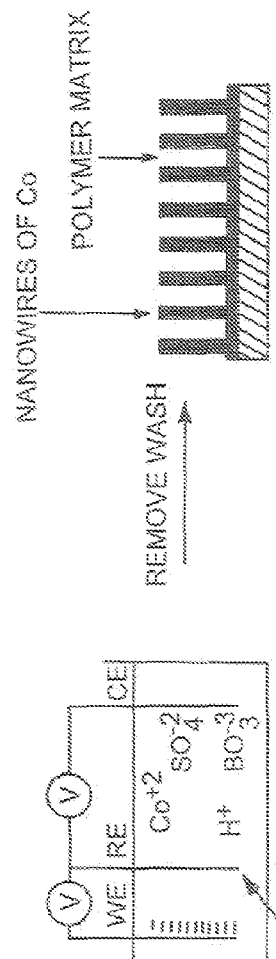

NANOCYLINDER ARRAYS

CROSS-REFERENCE TO RELATED APPLICATION

This application claims priority from U.S. Provisional Application Ser. No. 60/191,340 filed on Mar. 22, 2000, which is incorporated herein by reference in its entirety.

GOVERNMENT RIGHTS

This invention was made with government support under U.S. National Science Foundation Grant No. CTS-9871782, U.S. Department of Energy Grant No. DE-FG02-96ERA45612, and U.S. National Science Foundation Grant No. DMR-9809365. The government has certain rights in this invention.

TECHNICAL FIELD

The invention relates to arrays of nanoscopic structures. In particular, the invention relates to ordered arrays of nanoscopic structures.

BACKGROUND

Ordered arrays of materials on substrates are useful in a large number of applications. Ultra-high density arrays of nanoscale elements promise significant advancement in future technologies ranging from magnetic storage to optoelectronics to thermoelectric cooling. However, the parallel fabrication of well-ordered arrays in a controlled manner has proved difficult.

Approaches based on porous aluminum oxide (Anopore™), ion-track-etched polycarbonate (Nuclepore™), ion-track-etched mica, and other approaches, have been attempted. Examples of these are disclosed by Mitchell et al., in "Template-Synthesized Nanomaterials in Electrochemistry," *Electroanalytical Chemistry*, A. J. Bard and I. Rubinstein, Eds., 21, (1999), 1–74; Strijkers et al., in "Structure and Magnetization of Arrays of Electrodeposited Co Wires in Anodic Alumina," *J. App. Phys.*, 86, (1999), 5141; Han et al., in "Preparation of Noble Metal Nanowires Using Hexagonal Mesoporous Silica SBA-15," *Chem. Mater.*, 12, (2000), 2068–2069; Whitney et al., in "Fabrication and Magnetic Properties of Arrays of Metallic Nanowires," *Science*, 261, (1993), 1316; and in U.S. Pat. No. 6,185,961 for "Nanopost arrays and process for making same," to Tonucci et al.; and U.S. Pat. No. 6,187,165 for "Arrays of semi-metallic bismuth nanowires and fabrication techniques therefore," to Chien et al.

SUMMARY

By coupling the self-assembly of copolymers, e.g., diblock copolymers, in thin films with subsequent chemical modification, the new methods provide a pathway to a rapid, robust, and reliable fabrication of well-ordered arrays of oriented nanowires having widely tunable aspect ratios, ultra-high densities ($1.25 \times 10^{12}/in^2$), and high magnetic coercivity. These features are accomplished by electrodeposition of the nanowires within the pores of a nanoscale template derived from copolymer films.

The methods described here are based on the self-assembled morphology of copolymers, e.g., diblock copolymers, to template the formation of an array of a functional material such as an inorganic material. Copolymers, such as diblock copolymers, comprised of two chemically distinct polymers covalently linked at one end, can self-assemble into well-ordered arrays.

Annealing a thin film of such an asymmetric diblock copolymer between two electrodes under an applied electric field causes cylindrical microdomains to become oriented in parallel to the field lines. Selective removal of the minor component produces a porous material having pore sizes in the tens of nanometers range. Subsequently, electrodeposition or other methods can be used to fill the large aspect-ratio pores with conducting, magnetic, or other materials in a highly controlled manner.

In general, the invention features a method of preparing an array of nanopores by at least partially coating a conducting or semiconducting substrate (e.g., a metal, such as gold) with a copolymer, e.g., a diblock copolymer, including a first component and a second component; mobilizing molecules in the copolymer for a time sufficient to allow the first component of the copolymer to form nanoscopic microdomains (e.g., in the form of cylinders) within the second component of the copolymer; orienting the nanoscopic cylinders of the first component within the second component to form an oriented copolymer; immobilizing molecules in the oriented copolymer; and removing at least a portion (e.g., a majority, or substantially all) of the first component from the oriented copolymer to form an array of nanopores in the copolymer. In this method, the copolymer can be in the form of a film, and the nanoscopic cylinders can be arranged in parallel and be vertically oriented with respect to the substrate.

In these methods, the molecules in the copolymer can be mobilized by heating the copolymer to a temperature above the glass transition temperatures of both the first and second components (e.g., for at least 30 minutes to an hour or more), and the molecules in the oriented copolymer can be immobilized by cooling the copolymer to below said glass transition temperatures. Alternatively, the molecules can be mobilized by adding a solvent, plasticizer, or a supercritical fluid to the copolymer, and than immobilized in the oriented copolymer by removing the solvent, plasticizer, or supercritical fluid. In these methods, the mobilizing and orienting steps can be conducted simultaneously, or the copolymer can be first exposed to an orienting force, then have its molecules mobilized, and then have the molecules immobilized.

The nanoscopic cylinders are oriented by exposing the copolymer to an orienting force. For example, the nanoscopic cylinders can be oriented by arranging a conducting layer on a surface of the copolymer to form a composite structure; establishing an electric field (e.g., with a strength of from about 5 to about 10 V/μm) through the copolymer; heating the composite structure above the glass transition temperatures of both the first and second components for a time sufficient to allow the formation of nanoscopic cylinders; and cooling the composite structure to a temperature below the glass transition temperature of both the first and second components. The electric field can be removed after cooling the composite structure. In this method, the conducting layer can be a conducting material, such as a metal, and a further polymeric material, e.g., a polyimide. In addition, the heating can be carried out before or during establishing the electric field.

In addition, in these methods, an elastomeric material can be applied to a surface of the copolymer to produce a smooth, oriented copolymer film surface. To remove at least a portion of the first component from the oriented copolymer, one selectively degrades or decomposes the first component and not the second component. This can be done, for example, by exposing the oriented copolymer to a degradation agent that selectively degrades the first component. The degradation agent can be, e.g., radiation (such as is ultraviolet radiation or an electron beam), a solvent (such as acetic acid), or a reactive oxygen compound.

In another embodiment, the new methods can further involve at least partially filling the nanoscopic pores with a material (e.g., a magnetic material or a metal), for example by electrochemical deposition, e.g., in alternating layers of a magnetic metal and a non-magnetic material. In some embodiments, the nanoscopic pores and surface of the matrix are wetted with a surfactant prior to filling the nanopores with a material, and an electrical current can be used to control the amount of material deposited in the pores.

In another aspect, the invention features an array of nanopores manufactured by the new methods. The new nanopore arrays include a polymer matrix and a plurality of nanopores within the matrix, the nanopores each having a diameter of from 1.0 to 100 nm (e.g., 5.0 to 50 nm) and a having a periodicity of from 1.0 to 100 nanometers (e.g., 5 to 50 nm). The nanopores can be arranged in a hexagonal, close-packed configuration, and can be vertically oriented and in parallel.

The invention also features a nanoscale array that includes a substrate (e.g., of a metal such as gold) and nanowires (e.g., of a metal or magnetic material) arranged in parallel on the substrate, the nanowires each having a diameter of 1.0 to 100 nanometers (e.g., 5 to 50 nm), and having a periodicity of 1.0 to 100 nanometers (e.g., 5 to 50 nm). The nanowires can be vertically oriented. The nanoscale array can include a matrix, e.g., of a polymer, between the nanowires.

In yet another aspect, the invention includes a magnetic array including a substrate and an array of nanoscopic cylinders of a magnetic material (e.g., cobalt or copper) and arranged in parallel on the substrate. This array too can include a matrix disposed between the magnetic cylinders. Each of the cylinders can have a diameter of about 1.0 to about 100 nanometers, and a periodicity of from about 1.0 to about 100 nanometers. The magnetic array can have alternating layers of a magnetic metal and a non-magnetic material. The magnetic arrays can be used to manufacture magnetic storage media and magnetoresistance devices.

As used herein, the term "vertically-oriented," when referring to a copolymer film means a film that has cylindrical pores with the axis of the pores substantially normal to the surface with which the film is associated, or substantially normal to the film surface itself. The new materials can have cylindrical pores that are vertically oriented, or oriented at an angle to vertical, as long as the cylinders are oriented in substantially the same direction, e.g., in parallel. These cylinders can have various shapes and can, but need not, have a circular diameter cross-section.

As used herein, the term "nanoscale" refers to a characteristic size range, for example, of arrays, that is attained using the methods of self-assembly of copolymer molecules described herein. For example, the pore diameter, the wire diameter, the wire lengths and the period of the array can be in the nanoscale range, that is, within a range of about a nanometer to over a thousand nanometers. As used herein, the term "multilayered" describes a structural element within a single layer of electrodeposition that contains more than one material.

As used herein the term "nanowire" refers to nanoscale material created in an array pore. The term does not imply that the aspect ratio of the material need be high, and in some embodiments, the material to be deposited in an array can have a low aspect ratio. "Nanowires" can also refer to material that is not necessarily electrically conductive, but is nevertheless useful when present in nanoscale arrays.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The techniques and systems described herein include many advantages. For example, the extremely high density of the magnetic cylinders in the new films offers the capability of using this system for next-generation magnetic data storage applications, with potential data storage densities in excess of 1000 Gbit/in$^2$. The well-controlled size and separation distance of the magnetic metals on the metal, e.g., gold, film also offer the means to engineer next-generation giant-magnetoresistance magnetic-field-sensing devices.

The processes are parallel, scaleable, and not subject to the speed limitations experienced in nanofabrication techniques based on serial writing. The techniques are amenable to manufacture, in that they are simple, fast, and cost-effective. They are readily adoptable by industry and compatible with other fabrication processes.

Other features and advantages of the invention will be apparent from the following detailed description, and from the claims.

BRIEF DESCRIPTION OF DRAWINGS

FIG. 1 is a schematic representation of the process of fabricating ordered nanoporous template films.

FIG. 2 is a schematic representation of the process of electrochemical deposition of a magnetic material into the nanopores of a template.

DETAILED DESCRIPTION

Figure 3:
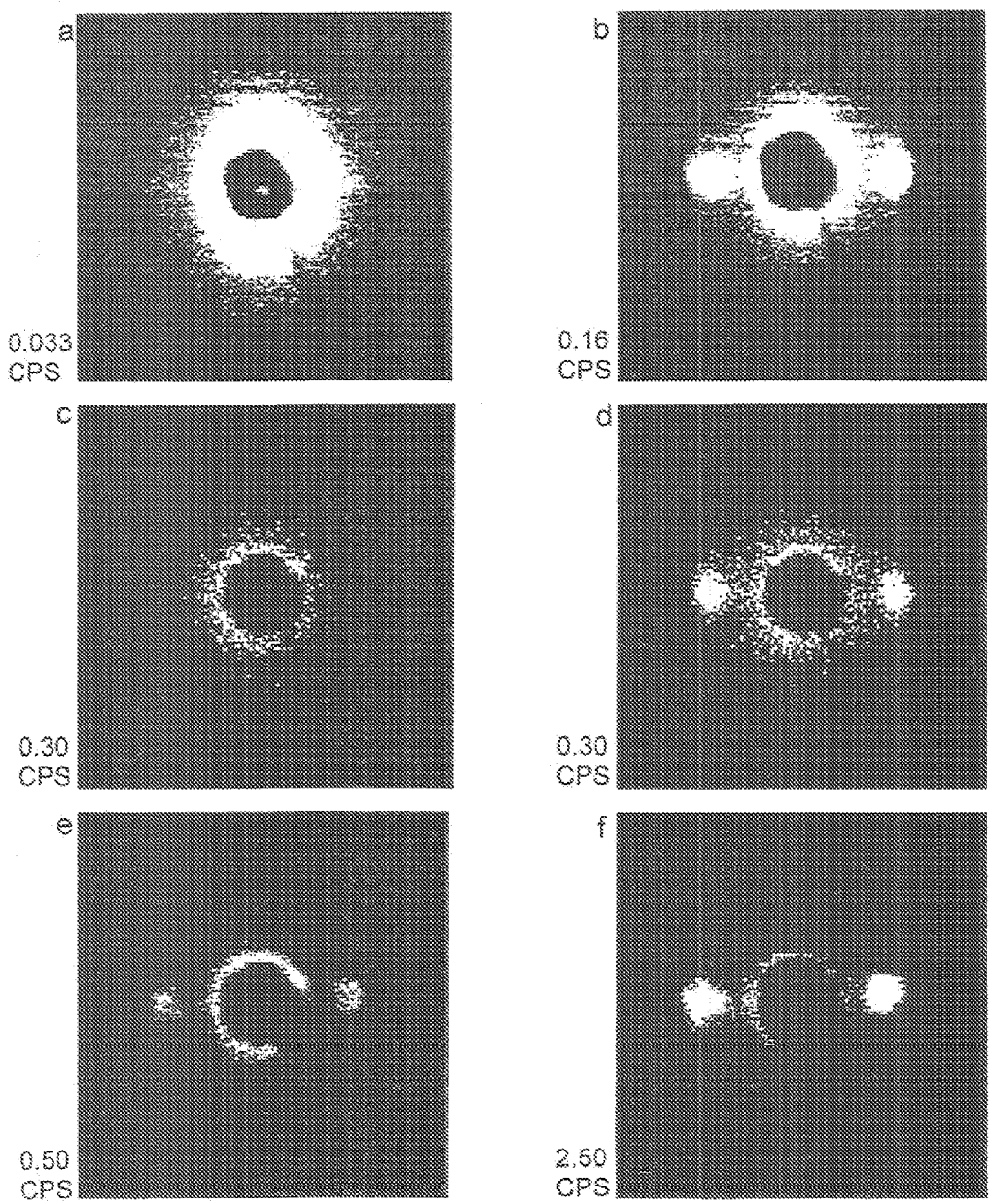
FIG. 3A is a small angle X-ray scattering pattern of a 1.0 micrometer, 70/30 by volume polystyrene/polymethylmethacrylate sample oriented in a 20–40×10$^6$ volt/meter electric field.
FIG. 3B is a small angle X-ray scattering pattern of the sample after pore formation.
FIG. 3C is a small angle X-ray scattering pattern of the sample after placing a droplet of a methanol/water (20/80) mixture on the sample.
FIG. 3D is a small angle X-ray scattering pattern of the sample after placing a droplet of water on the sample.
FIG. 3E is a small angle X-ray scattering pattern of the sample before electroplating with cobalt.
FIG. 3F is a small angle X-ray scattering pattern of the sample after electroplating with cobalt.

Ultra-high-density arrays of nanoscale elements promise significant advancement in future technologies ranging from magnetic storage to opto-electronics to thermoelectric cooling. However, the parallel fabrication of well-ordered arrays in a controlled manner has proven difficult. By coupling the self-assembly of diblock copolymers in thin films with subsequent chemical modification, a pathway to a rapid and reliable fabrication of such arrays is provided. Here described is a simple, yet highly robust method to produce well-ordered arrays of vertically-oriented, ferromagnetic nanowires having large aspect ratios, ultra-high densities ($1.25 \times 10^{12}/in^2$) and high magnetic coercivity. This is accomplished by electrodeposition of nanowires within the pores of a nanoscale template derived from films of diblock copolymers. Since the processes presented here are chemical in nature, they are highly-parallel, scaleable, and not subject to the speed limitations experienced in nanofabrication techniques based on serial writing.

The methods described here are based on the self-assembled morphology of diblock copolymers to template the formation of an array of a functional material. As shown in FIG. 1, annealing a thin film of such an asymmetric diblock copolymer between two electrodes under an applied electric field causes cylindrical microdomains to orient parallel to the field lines. Selective removal of the minor component produces a porous material having pore sizes in the nanometer range. Subsequently, electrodeposition provides a convenient means of filling the large aspect-ratio pores in a highly controlled manner.

General Methodology

The fabrication process involves two primary chemical processing steps: (i) the preparation of a nanoporous polymer template, and (ii) the deposition, for example, electrochemical deposition, of nanowires inside the template pores. FIGS. 1A to 1D show preparation of a template, while FIG. 2 shows a deposition process. The techniques described herein are also disclosed in additional detail in Jörg M. Schotter, "Fabrication and Properties of Magnetic Nanostructures from Diblock Copolymer Templates," Master's Thesis (Department of Physics, University of Massachusetts at Amherst, Amherst Mass., 2000), 156 pages, which is incorporated by reference herein in its entirety.

First, a conducting or semiconducting substrate, for example a metal or semiconducting material, is selected for use in embodiments employing electrodeposition. The substrate for such applications may be a coating or a non-continuous surface layer on an underlying material that need not be conducting. The amount of substrate used can be any amount that allows the substrate to function as an electrode, when electrodeposition is used to deposit functional material. If other methods of material deposition are employed, the nature and amount of substrate is not limited. The substrate, in embodiments in which it is present as a coating or surface layer, can be applied to an underlying substrate by conventional lithographic techniques, or other known methods of depositing conducting materials on surfaces.

Of particular interest are: substrates at least partially coated with a thin film of metal; semiconducting substrates; and semiconducting substrates at least partially coated with a lithographically-designed, thin film, metal electrode. In some embodiments, the substrate can include metals, for example, gold. In other embodiments, the substrate can have gold coated or deposited on an underlying material. In some embodiments, the substrate can be a semi-metal oxide, including for example, silicon oxide. Particular preparation methods are not required, although in some embodiments, washing the substrate with water, followed by rinsing with mild acid and/or base can be carried out. A substrate chosen for use in the methods presented herein desirably undergoes oxidation at a rate that is slower than the rate at which functional material can be deposited on the substrate surface.

An underlying material, if used, can be rigid or non-rigid, depending on the desired application. Rigid underlying materials can be chosen for applications such as rigid display screens, and can include, for example, metals, plastics, glass, silicon in the form of chips or wafers, or any other rigid materials. Flexible underlying materials can be chosen for applications such as flexible displays, and can include, for example, polymeric materials such as polyimides, including KAPTON®, or any other flexible materials such as flexible polymers and silicons and the like.

The surface of the substrate is at least partially coated with a block copolymer film, for example, a diblock copolymer. The copolymer is first deposited by any means useful for depositing copolymers on surfaces, for example, spun-cast from solution, onto a substrate. Diblock copolymers are employed in some embodiments, where the fraction of one component in the block copolymer is such that in a bulk specimen, this component forms nanoscopic cylinders embedded in a matrix comprised of the other component.

Diblock copolymers, comprised of two chemically distinct polymers covalently linked end-to-end, can be self-assembled into well-ordered arrays of spheres, cylinders or lamellae, depending on the volume fraction of the components comprising the polymer chain. Vertically oriented, cylindrical phase diblock copolymer films are created. The total molecular weight of the copolymer dictates the size of the domains, but is limited to being molecular in size. If the volume fraction of a major component is about 0.7 (e.g., from about 0.65 to about 0.80), any copolymer will self-assemble into a hexagonal array of cylinders of the minor component embedded in a matrix of the major component. The mole ratio of the minor component of the diblock copolymer can range from about 0.20 to about 0.35 to permit the formation of microphases such as will result in cylinder formation. If the volume fraction of the major component is about 0.9, the minor component will form spheres, which can be elongated into very thin cylinders when an orienting field, e.g., an electric field, is applied.

A mixture of diblock copolymers, such as A-B and A-C diblock copolymers, can be used to create cylinders of different types, for example B and C cylinders. Higher block copolymers, such as A-B-C triblock copolymers can also be used. The molecular weight of the copolymer can be varied to achieve differing cylinder diameters. For example, a molecular weight copolymer in the range of about 1.5 million molecular weight units (Daltons) can result in a cylinder diameter of about 70 nm. A molecular weight in the range of about 20,000 Daltons can result in a cylinder diameter of about 14 nm. A molecular weight of about 4 million Daltons results in cylinders with a diameter of about 100 nm, while a molecular weight of about 15 kilodaltons results in a diameter of about 1.0 nm.

For some embodiments, the use of a block copolymer including a component that can be crosslinked is desirable. This component can be crosslinked before or during removal of another component, and can therefore add structural integrity to the copolymer. This component can be referred to as the matrix component. In some embodiments, the matrix component will be the major component of a copolymer, by volume. Suitable matrix components include polystyrene, polybutadiene, polydimethylsiloxane, and other polymers. The component that is to be removed can be called the core component. In some embodiments, the core component will be a minor component of a copolymer, by volume. Suitable core components include polymethylmethacrylate, polybutadiene, polycaprolactone or a photoresist. Generally, core components are materials that can be degraded or decomposed differentially than the matrix material.

In other embodiments, block copolymers of styrene and methylmethacrylate can be used. In some embodiments, the methylmethacrylate block constitutes a minor component. For example, a 70/30 (by volume) diblock copolymer of polystyrene/polymethylmethacrylate can be employed. Any block copolymers can be used, such as alkyl/alkyl, alkyl/aryl, aryl/aryl, hydrophilic/hydrophilic, hydrophilic/hydrophobic, hydrophobic/hydrophobic, positively or negatively charged/positively or negatively charged, uncharged/positively or negatively charged, or uncharged/uncharged. The film thickness can vary as desired, for example, from about 0.5 nm to about 10 cm, or from about 1 nm to about 1 cm, or from about 5 nm to about 1000 nm.

Block copolymers can self-assemble into a cylindrical morphology when heated above the glass transition temperature of the copolymer and an electric field is applied to orient, e.g., vertically orient, the copolymer. The method of using an electric field to orient the sample relies on differences between the dielectric constant of the components of the block copolymer. Other methods for orienting the copolymers can rely on, for example, magnetic fields (due to differences in the magnetic dipole moment of the components of the copolymer), or solvent interactions (due to differences in the miscibility of the components of the copolymer with the solvent).

For electric field-induced orientation, the different chemical constitutions of the blocks of the copolymer can result in a difference in the dielectric constants of the copolymer domains. A difference of about 0.1% in the dielectric constants can result in a specific, e.g., vertical, orientation. In an electric field, the orientation dependent polarization energy associated with the cylinders, dielectric bodies that are anisotropic in shape, will align the cylinders in parallel to the electric field lines, for example, as described in Morkved, et al., "Local control of microdomain orientation in diblock copolymer thin films with electric fields," *Science,* 273, (1996), 93 1; Thurn-Albrecht, et al., "Overcoming Interfacial Interactions with Electric Fields," *Macromolecules,* 33, (2000) 3250-53; Amundson, et al., "Alignment of lamellar block-copolymer microstructure in an electric-field. 1. Alignment kinetics," *Macromolecules* 26, (1993), 2698; and Amundson, et al., "Alignment of lamellar block-copolymer microstructure in an electric-field. 2. Mechanisms of alignment," *Macromolecules* 27, (1994), 6559.

Under strong enough fields parallel to the substrate, any surface induced alignment of the morphology can be overcome, producing cylindrical microdomains oriented in parallel with the fields, which can be normal to the substrate, that extend completely through a one-micron-thick sample. Scattering experiments are an easy means to characterize the orientation of the microphase structure in a thin film. When viewed from the side, a cylindrical structure oriented normal to the substrate is laterally periodic. Consequently, the scattering pattern measured at a finite incidence angle is strongly anisotropic, consisting of two equatorial Bragg peaks.

In some embodiments employing an electrical field to orient the polymer film, a removable conducting layer is placed on top of the copolymer film, sandwiching the film between two electrodes. For example, a conducting layer can be deposited by spin coating and then, after annealing, be removed by etching, e.g., by solvent chemical, or physical etching. Alternatively, a "spin-on" sacrificial layer can be applied, followed by a metal layer that is evaporated, sputtered, or spun-on. After annealing, the sacrificial layer can be removed by solvent, chemical, or physical etching. This conducting layer can be metal, or semiconducting material, and can optionally be in contact with the entire film surface. For example, aluminum, copper, gold or other metal can be used as the conducting layer on the copolymer film.

Metallized layers, such as aluminized KAPTON® can also be used. Metallized layers can promote the formation of a uniform film surface as orientation, e.g., vertical orientation, is carried out. For example, in some embodiments, the use of a metal conducting layer alone, in direct contact with the copolymer film, can result in damage to the copolymer layer as the conducting layer is removed, due to sticking and/or tearing. Aluminized Kapton is a layer of aluminum in register with a layer of Kapton, in which the Kapton layer is directly in contact with the copolymer film. The Kapton layer must not be so thick as to interfere with an electric field established between the aluminum layer and the substrate on the other side of the film. Other metals and other polymeric materials can be used to create metallized layers for electric field-induced vertical orientation.

To mobilize the molecules in the copolymer, the sandwich structure can be heated above the glass transition temperature of the copolymer. Voltage is then applied between the substrate and the conducting layer to create an electric field through the mobilized copolymer film. The electric field strengths are at least 5 V/µm, for example, at least 10 V/µm.

After holding the film in this state for a sufficient time to allow the copolymers to self-assemble, for example, over 30 minutes, over 60 minutes, over 1.5, over 2, or over 3 hours, the copolymer film assembly is cooled to a temperature below the glass transition temperature of the copolymer. The orienting field, e.g., electric field, is desirably turned off after the cooling has taken place. At this point the conducting layer, and any associated additional layer, is removed from the polymer film. The film now includes an ordered array of cylinders of one copolymer component embedded in a matrix of another copolymer component. Self-assembly results in parallel orientation of the blocks, such that one component forms cylinders with the cylinder axis substantially in parallel to each other, e.g., all normal to the surface of the substrate, or substantially normal to the film surface itself. The cylinders desirably extend substantially from the substrate surface to the surface of the film. The cylinders have diameters ranging from about 5 nm to about 100 nm. The periodicity (L) of the cylindrical domains in the film is the distance between the central axes of the cylinders, and is proportional to the molecular weight of the copolymer (to the ⅔ power). In embodiments in which the mole fraction of the minor component is from 0.2 to 0.35, and the cylinders are hexagonally packed, the periodicity defines the diameter of the cylinders. Periodicity can range, for example, from about 1.0 to about 70 nm, but can be outside this range.

In other embodiments, methods other than heating are used to make the molecules of the copolymer mobile. For example, rather than heating the copolymer to its glass transition temperature, one can, in effect, lower the glass transition temperature, by any of a number of ways. For example, one can add a plasticizer, a solvent, or a supercritical fluid, such as supercritical $CO_2$, to the copolymer to mobilize the molecules and allow them to move and self-assemble. An orienting field is applied, and the plasticizer, solvent, or supercritical fluid is removed to immobilize the molecules. Thereafter, the orienting field is removed, but the immobilized molecules maintain their orientation.

The surface of the copolymer film obtained after orientation can be used as formed for a number of applications. For some applications, the surface of the vertically oriented copolymer film is desirably substantially smooth. For example, for magnetic data storage applications, in which a reading device passes rapidly over a magnetic array, the surface is desirably smooth. Any application in which a read or write head passes over an array can require high smoothness. Smoothness of a magnetic array for data storage and retrieval applications desirably ranges from about 0.5 to about 5.0 nm. The surfaces of vertically oriented copolymer films can be made smooth with the use of an additional material, such as an elastomer or a crosslinked elastomer applied to the conducting layer before vertical orientation steps are undertaken. For example, an additional material, such as a crosslinked silicone, including crosslinked-polydialkylsiloxanes, -polydiarylsiloxanes, or -polyalkyl-arylsiloxanes, including, for example, crosslinked-polydimethylsiloxane, can be applied to a conducting layer, or in some embodiments, to an additional layer, as described above. The conducting layer, and/or any associated additional layer, is coated with the additional elastomeric material, and the layers placed in contact with the copolymer film. Vertical orientation is carried out, as described above, and the layers removed from the surface of the vertically oriented copolymer film. The surface can be made thereby smoother than surfaces created without the additional elastomeric material.

FIGS. 1A and 1B are side view, schematic representations of an diblock copolymer annealed above the glass transition temperature of the copolymer between two electrodes under an applied electric field forming a hexagonal array of cylinders oriented normal to the film surface. With reference to FIG. 1A, underlying material 10 has substrate 12 coating its surface. Diblock copolymer film 14 is present overlying the substrate surface, and conducting layer 16 is in contact with the surface of copolymer 14. As can be seen in FIG. 1A, diblock copolymer film 14 is not substantially oriented overall. Voltage source 18 is electrically connected to each of substrate 12 and conducting layer 16. Application of a voltage between substrate 12 and conducting layer 16 results in an electric field throughout film 14. As long as film 14 is able to experience the electrical field, and to orient itself in response to the electric field, self-assembly into regular arrays is possible. The electric field can vary according to the material comprising the copolymer film, and the thickness of the film. The electric field value can be at least about 5 V/μm, or at least about 10 V/μm. The establishment of an electric field through the copolymer film can be carried out before heating begins, as the film is heated, or after the heating step is completed.

In some embodiments, the film is heated to a temperature above its glass transition temperature. For example, at least about 2° C., 5° C., 15° C. above its glass transition temperature. The upper limit of heating is limited by the stability of the copolymer film and other elements of the array, including substrate and underlying material, at high temperatures. The film can be heated for any time that is sufficient to bring the copolymer film to a temperature above its glass transition temperature. The heat is then maintained for a time sufficient to allow mobilization of the copolymer molecules, and self-assembly induced by the effects of an orienting field. With reference to FIG. 1B, copolymer film 14 is vertically oriented, with first component 22 and second component 24 found in zones that extend through film 14. The temperature of film 14 is reduced to a temperature below the glass transition temperature, for example, at least 2° C., 5° C., or 15° C. below the glass transition temperature.

Conducting layer 16 is removed and film 14 is further processed as described herein.

Subsequently, the film is exposed to an energy source or agent that substantially selectively degrades or decomposes one component of the copolymer over another component. For example, radiation sources such as ultraviolet light, x-ray radiation, gamma radiation, visible light, heat, or an electron beam can be used to selectively degrade one of the copolymer. Degradation or decomposing agents such as reactive oxygen species, including for example, ozone, or solvents such as ethanol, can also be used. Ultraviolet light can be used to degrade, for example, polymethylmethacrylate as a core component. Ethanol can be used to degrade, for example, polybutadiene.

Degradation of a copolymer component is desirably followed or accompanied by removal of any residue that may result from the degradation. For example, treatment of a diblock copolymer with an electron beam can result in a component of the copolymer being degraded to a residue that is not considered desirable for the purposes of the methods and arrays described herein. For example, a residual degraded component of the copolymer can at least partially fill nanopores formed in the process, and can interfere with the efficiency of subsequent process steps, or of array performance in general, for example, by diminishing electrical contact between the substrate and any electrically conductive material placed in the nanopores. A step to remove any residual component can include treatment with a liquid, including washing with a solvent, or a material that reacts preferentially with the residual component, such as an acid or a base. In some embodiments, the material used to react with residual degraded component can be, for example, a dilute form of acetic acid.

In some embodiments, it may be desirable to optionally cross-link a component of the copolymer film. Cross-linking of a component that is not degraded by an energy source or agent can add structural strength to the film. In some embodiments, a copolymer component is crosslinked simultaneously with the degradation of another copolymer component. FIG. 1C shows the film in a configuration which is suitable for degradation of one of the copolymer components. For example, in the case of polymethylmethacrylate (PMMA) cylinders in a polystyrene (PS) matrix, ultraviolet radiation degrades the PMMA while crosslinking the PS. It is desirable that the initial morphology of the copolymer be retained throughout the entire process of degradation.

FIG. 1D shows that after removal of the minor component, a nanoporous film is formed. With reference to FIG. 1D, the copolymer film has been transformed into nanoporous film 26, with matrix areas 28, and cylindrical pores 30, which extend substantially from upper surface 32 of nanoporous film 26 to the surface of substrate 12. The thickness of the film and the diameters of the cylindrical domains will determine the aspect ratio of the nanopores. The dimensions of the pores generally are the same as those of the cylindrical domains of the vertically oriented copolymer film, and as such, the pore diameters can range from about 5 nm to about 100 nm or more, and the periodicity can range from about 5.0 to 70 nm.

Such a nanoporous film is prepared as a template for the deposition of material in nanopores. For applications in which the material is electrically conductive, or semiconductive, the material can be referred to as nanowire material. Such a designation as a "nanowire" does not imply that the aspect ratio of the material need be high, and in some embodiments, the material to be deposited in an array can have a low aspect ratio. "Nanowires" can also refer to material that is not necessarily electrically conductive, but is nevertheless useful when present in nanoscale arrays.

Deposition of functional material can be carried out by, for example, electrodeposition, chemical vapor deposition, electroless deposition, surface chemistry, chemical adsorption, and chemically driven layer-by-layer deposition. For deposition of material in pores that have depths of more than about 30 nm, electrodeposition is a desirable method, since it provides a driving force for the deposition of material into the bottoms of the pores.

For example, electrodeposition within the pores of a nanoscale template derived from films of diblock copolymers provides a convenient means of filling large aspect-ratio pores in a highly controlled manner to provide an array of nanowires. Any material that can be electrodeposited is a candidate for use in arrays of nanopores. The dimensions of nanowires in the arrays are generally the same as those of the nanopores, with the exception that the nanopores need not be completely filled, and low aspect nanowires can be formed by substantially incomplete filling of even high aspect nanopores. For applications in which low aspect ratio nanowires are desirable, the matrix material can be removed by treatment with an agent that degrades the matrix material selectively with respect to the nanowires.

For some applications, the surface of the film is desirably treated, for example made smooth, by milling, for example. Such film surface treatment includes the removal of a portion of the copolymer film and the removal of nanowire material from the array can be minimized if the nanopores are not completely filled. Nanowires, as generally described, can range in length from about 0.5 nm to the centimeter range, for example, from about 0.5 nm to about 1.0 cm, or from about 1.0 nm to about 5 mm.

For those applications relying on magnetic properties of the array, the nanowires include at least some magnetic material. Magnetic materials are those materials that are measurably magnetic, and can include magnetic metals, such as cobalt, nickel, iron, rare-earth magnetic materials, and alloys that contain one or more of these materials (such as iron-platinum alloys, or PERMALLOY (an alloy of iron and nickel, with a stoichiometry of Ni81Fe19)), as well as magnetic non-metals, including ceramic materials such as strontium or barium in combination with iron oxide. Organic magnets, such as tetracyanoethylene, can also be employed as magnetic materials. Magnetic systems can also contain materials that are non-magnetic, including non-magnetic metals, such as copper, gold, silver, and the like.

Magnetic materials can also be prepared as magnetic nanowires by deposition of alternating layers of magnetic metals and non-magnetic materials. Such alternating layers can be optionally and, for some embodiments desirably, regularly alternating, and the regularity can include regularly alternating amounts of such materials. For example, a magnetic nanowire can include at least three layers of material alternating as: magnetic metal, non-magnetic material, magnetic metal; or non-magnetic material, magnetic metal, non-magnetic material. The alternating layers can be optionally, and in some embodiments desirably, non-regularly alternating. More details are given in "Magnetic Multilayers and Giant Magnetoresistance : Fundamentals and Industrial Applications (Springer Series in Surface Sciences, No 37)," Uwe Hartmann (editor), 370 pages, (Springer-Verlag, 2000), which is incorporated herein by reference. Cobalt/copper alternating multilayers have been found to be useful.

Magnetic materials can be generally chosen to have a selected magnetic coercivity, which will depend on the desired application. For example, by using just cobalt (Co) nanowires, the coercivity can range from a theoretical maximum of about 7000 Oe, to any lower number. The coercivity can be tuned to smaller values by selecting specific electrodeposition conditions, pore diameter, and additives. For example, using the techniques described herein (applied field perpendicular to the substrate and parallel to wire axis), one can establish perpendicular coercivity of about 800 Oe at room temperature. Higher coercivities should be obtained by depositing rare earth magnetic materials.

Magnetic materials can also have their magnetoresistive behavior tuned by adjusting the thickness of the magnetic sections, the thickness of the normal metal sections, and the diameter of the multilayered nanowires. These devices are so-called "giant" magnetoresistive devices, which are sensitive magnetic field sensors, in that the resistance changes dramatically with a change in magnetic field. One can also intentionally make "two-state" devices using non-regular multilayering. For example, a thick magnetic layer, followed by a thin normal metal layer, and then followed by a thin magnetic layer can be deposited in nanowires to form an array useful to design a two-state device.

In other embodiments, one can reverse the magnetization state of the smaller magnetic layer by increasing the current through the device. A spin-polarized electron current leaves the larger magnetic region and is injected into the smaller magnet. This current exerts a torque on the magnetization in the smaller magnet and can reverse the direction of magnetization. The change in magnetization is typically accompanied by a discrete change in measured resistance. This results in a way to "write and read" using current. One can "write" with a larger current, and "read" with a smaller current. These concepts are discussed in Katine et al., "Current-driven magnetization reversal and spin-wave excitations in Co/Cu/Co pillars," *Phys. Rev. Lett.*, 84, (2000), 3149. Optimal electrodeposition of magnetic material can involve the alignment of the magnetic axis of the material normal to the surface upon which the magnetic material is deposited.

For those applications that do not rely on magnetic properties of arrays, any other material which can be deposited, for example, electrodeposited, can be employed, including metals generally (for example, copper, gold and others), semi-metals such as n-type and p-type semi-metals (including, for example, Bi and BiTe), and certain semiconducting materials. For the normal metal layers, in addition, to Cu and Au, Ag, Cr, Pt, Pd, Mo are all of relevance.

For particular applications, the matrix material is desirably removed from the substrate surface after deposition of functional material. In other applications, the matrix material is desirably present subsequent to deposition to provide structural stability to the array of nanowires. This can be achieved by treating the array with an agent that selectively degrades the matrix material with respect to the nanowires as described above. For example, treating a polystyrene matrix by reactive ion etching results in the degradation of the matrix, while cobalt nanowires in the array are not affected.

The techniques described herein can be employed to create high-density arrays of numerous types of materials on a substrate surface, having a wide variety of uses. These nanostructured arrays can be used in a number of technologies, including thermoelectric cooling, magnetic data storage, field emission devices, giant magnetoresistive devices, electrochemical sensor technology, and molecular electronics technology, for example. Nanostructured arrays of magnetic material can directly impact two areas of electronics technology: (i) magnetic data storage applications, and (ii) engineered magnetoresistance applications. The techniques presented here are general and should provide advances to a variety of research materials systems.

Magnetic Data Storage Applications

Next generation magnetic data storage technologies will utilize perpendicular magnetic media to store data. Present technologies use lateral magnetic media in which the magnetic storage elements lie along the surface of the substrate. In an effort to pack more elements per unit area, the size of the basic elements must be reduced. This introduces a problem, however, because as the scale of these regions is reduced, so is the blocking temperature which marks the onset of superparamagnetism. The blocking temperature must be kept large, otherwise the stored magnetization state of each element will decay and data will be lost.

One way to reduce the size scale of a magnetic media element without substantially reducing the blocking temperature is to utilize shape and volume, that is, to make small cylindrically-shaped objects of high aspect ratio. A cylindrically-shaped magnet of diameter 10 nm and length of 500 nm will have a much higher blocking temperature than that of a spherical magnet of 10 nm diameter. The highest spatial packing density of magnetic cylinders occurs for cylinders in a vertical hexagonal closed-packed arrangement.

In the bulk, pure cobalt is a soft ferromagnet of relatively low coercivity and not necessarily an ideal material for magnetic data storage. However, certain proprietary cobalt alloys have "designer" magnetic properties including engineered coercivity which makes them useful for present-day magnetic media applications. These cobalt alloys can be electro-deposited from a specific plating bath containing the relevant ions.

The techniques described herein can be used to create arrays useful for the next generation of magnetic data storage. Since the surface smoothness of such arrays can be important, it is considered desirable to utilize an auxiliary polymer, such as, for example, a crosslinked silicone, including crosslinked-polydialkylsiloxanes, -polydiarylsiloxanes, or -polyalkylarylsiloxanes, including, for example, crosslinked-polydimethylsiloxane, to produce highly smooth films on substrate surfaces, as described herein.

Engineered Magnetoresistance Applications

Magneto-electronic devices can be used for magnetic sensing applications (for example, magnetic data storage) and for "spintronics" (for example, MRAM). Appropriately chosen nanoscale magnetic architectures can result in improved performance since magnetic interactions can be tuned at the nanometer scale. The techniques described herein can be used to create devices in a variety of useful magneto-electronic configurations.

Materials have been developed over the last ten years that are now used for magnetic sensing by utilizing their giant magnetoresistive (GMR) properties. These materials have various architectures, but in general are multilayered materials with layers of non-magnetic materials, including metals, in contact with layers of magnetic metals. The magnetic interlayer-exchange-coupling and electron spin-dependent scattering lead to the sensitivity of resistance with respect to magnetic field. Tuning the structure of these systems by materials engineering allows the magnetoresistive properties to be optimized for applications. GMR read heads in hard-disk drive technology are an example of one important commercial application. These engineered materials systems are expected to advance with better materials and new material architectures.

The magnetic arrays made using techniques described herein show GMR type behavior. However, the architecture of these arrays is significantly different from others that have been produced. The important consideration for GMR device design is that there be electrical contact between the substrate and the magnetic nanowires, not whether the wires are embedded in the template or not. Therefore, the wires can be grown (that is, electrodeposited) to less than the film thickness for GMR devices without a need to remove matrix material prior to operability.

Of key importance to optimal performance of GMR devices is the ability to form a regular array of very small dimensions, for example, an array of 25.4 nanometer period made of cylinders 11 nanometers in diameter. Furthermore the fabrication processes described herein permit the well-controlled height of the cylinders, and the ability to multi-layer the cylinder material as it is grown. These new processing considerations have allowed the creation of new geometrical architectures at size scales that have not been achieved using known fabrication processes. By tuning material structure in the fabrication processes described herein, a new breed of GMR materials is possible.

The invention will be further described in the following examples, which do not limit the scope of the invention described in the claims.

EXAMPLES

The following examples illustrate the properties and advantages of particular embodiments of the invention.

Example 1

Fabrication of an Array of Magnetic Cobalt Nanowires on a Gold Substrate

A process for the fabrication of arrays of magnetic cobalt nanowires is presented. The presence of a functional array is verified by way of x-ray scattering and magnetoresistance measurements.

A film of cylindrical-phase PS/PMMA block copolymer, 1 micrometer in thickness, was applied to a gold-coated substrate by spin-coating. The PS/PMMA block copolymer used in this experiment had 29% PMMA by volume fraction and an average total molecular weight of 39,600 Daltons. The PMMA cylinders were then forced into a vertical orientation by the application of a 20–40×10$^6$ volt/meter electric field during an annealing step at 170□C for 14 hours. The electric field was applied by adding an aluminized Kapton film to the top of the diblock film and then applying a voltage difference across the aluminum film on top and the gold film on the bottom. After the annealing, the aluminized Kapton film was removed. The vertical orientation of cylinders was verified by small-angle x-ray scattering, neutron scattering, and by cross-sectional transmission electron microscopy.

The diblock-copolymer film was then exposed to ultraviolet radiation having a peak wavelength of 254 nanometers with a dose of 25 J/cm$^2$. Afterwards, the sample was rinsed in acetic acid for 3.5 hours and subsequently rinsed for 20 seconds in deionized water. Small-angle X-ray scattering measurements were used to verify the removal of the PMMA cylinders, as noted by a quantifiable increase in the scattering intensity. At this stage, the template is ready for electroplating.

The sample was then connected to a wire electrode and immersed in a cobalt plating solution for electrodeposition.

Plating was controlled with a computer-controlled deposition system. The aqueous plating bath consisted of 2.1 molar $CoSO_4$, a buffer of 0.3 molar $H_3BO_3$ and a 20% methanol surfactant by volume. The surfactant was a necessary component for electroplating into the nanoscale template pores in this experiment. Using small angle X-ray scattering, one could observe that water in the presence of a methanol surfactant enters the pores, whereas pure water did not. In addition, as observed by X-ray scattering and magnetoresistance measurements, electroplating without the surfactant was not successful, whereas plating with the surfactant was successful, and resulted in the formation of a magnetic array.

The plating was performed at room temperature. A current density of 100 ampere/cm$^2$ was applied between the working (sample) electrode and a platinum counter electrode from a constant current supply. $Co^{2+}$ ions were electrochemically reduced and deposited on to the exposed gold at the bottom of the template pores. In this fashion, the cylindrical pores were filled with metal from the bottom up. A nominal half-cell voltage of 1.1 volts was measured between a calomel reference electrode and the working electrode. The current was continuously integrated to determine the amount of charge transferred and thereby the mass of metal deposited. The plating process was terminated at an appropriate set-point to control the total thickness of deposited metal. Here, current was integrated for 144 seconds to yield a charge transfer of 0.123 Coulomb and a cobalt cylinder height of 500 nanometers.

The presence of the cobalt array was verified in several quantitative ways: First, a greatly enhanced scattering intensity of small-angle X-ray scattering of these samples was observed. There was a substantial difference between the X-ray scattering contrast in samples with pores filled with cobalt and pores filled with air. Second, the appearance of a peak in magnetoresistance measurements for the plated array samples was observed. These electrical characterization measurements were made in the plane of the gold film with an applied magnetic field directed normal to the film surface. In comparing films with and without the deposited cobalt array, a negative magnetoresistance peak was observed only for samples with the cobalt array. The observed negative magnetoresistance was an indication of the presence of "nanostructured" magnetic/non-magnetic metal interfaces, similar to that observed for granular and multilayered giant magnetoresistive materials.

Example 2

Preparation of a Polymer Template

An asymmetric diblock copolymers of polystyrene and polymethylmethacrylate, denoted P(S-b-MMA), with a molecular weight of 39,600 Daltons and a polydispersity index of 1.08, was synthesized anionically. The volume fraction of styrene was 0.71, so that in the bulk, the morphology consisted of PMMA cylinders (14 nm in diameter based on the styrene volume fraction and cross-sectional TEM) hexagonally packed in a PS matrix with a lattice constant of 24 nm. The diblock copolymer films were spin-coated from a toluene solution onto a 100 nm gold film that was evaporated onto a polyimide (KAPTON®) substrate (thickness 127 µm). The samples were then covered with another Kapton film (thickness 12.7 µm) which was aluminized on the top surface. The gold and the aluminum films served as electrodes. The samples were heated to 165° C., which is above the glass transition temperatures of the two components ($T_{g,PS}$=105° C., $T_{g,PMMA}$=115° C.), and annealed for about 14 hours under an electric field of 30–40 V/µm. Subsequently, the sample was cooled to room temperature, solidifying the copolymer before the field was removed. The upper electrode was then removed, and the sample was placed underneath a mercury UV lamp with maximum emission at 254 nm (25 J/cm$^2$ dosage). This caused chain scission of the PMMA block and crosslinking of the PS. The sample was then soaked for 3 hours in acetic acid and subsequently rinsed in deionized water to remove the products of the PMMA degradation. The resulting PS nanoporous template was optically transparent, such that the underlying gold film was clearly visible.

Example 3

Filling the Pores in a Polymer Template

The pores in the polymer template were filled with the desired metal by an electrochemical technique. Both Co arrays and Cu arrays were produced to illustrate the generality of the deposition technique; however, the discussion here focuses mainly on cobalt, a relevant candidate for studies of the magnetic properties of high-density nanowire arrays. The electrodeposition was performed in an electrolyte bath containing a cobalt salt (1.3 M $CoSO_4.5H_2O$) and a buffering acid (0.7 M $H_3BO_3$) at a pH of 3.7, prefiltered through a 0.2 µm filter. Methanol (20% by volume) was added as a surfactant to enable the electrolyte to wet the interior of the pores. Electroplating was performed at room temperature and atmospheric pressure. A standard three-electrode cell configuration (as described in Bard, A. J. and Faulkner, L. R., Electrochemical Methods (John Wiley, New York, 1980) was used with a computer-controlled, galvanostatic (constant current) electroplating circuit. The exposed gold on the template sample formed the working electrode, and its half-cell potential was monitored with respect to a standard calomel reference electrode (SCE). The counter electrode was a platinum foil with an 8 cm$^2$ surface area. To enable the desired reduction of cobalt ions at the working electrode, a potential at least as negative as −0.52 volt (the half-cell electrode potential against the SCE for the reaction $Co^{2+}+2e^-\rightarrow Co$) must be applied by the biasing circuit. Since the Kapton film insulates the backside of the sample, electrodeposition takes place only within the pores on the template side. Constant current densities in the range of 30–300 A/m$^2$ were used in various fabrication trials resulting in a deposition rate of 1–10 nm/s. To yield a controllable nanowire height, the current was integrated to track plating thickness and terminated electronically once the target cylinder height was reached.

Example 4

Small Angle X-Ray Scattering Measurements of Nanocylinder Arrays

Small-angle x-ray scattering (SAXS) was used as a nondestructive means of studying the internal structure of the film. SAXS is sensitive to structures on the length scale of several nanometers to several tens of nanometers. All small-angle X-ray scattering experiments were performed with Ni-filtered Cu-Kα radiation from a Rigaku rotating anode, operated at 8 kW. A pinhole-collimated beam impinging on the sample at an angle of incidence of 45° C. produces the scattering signal, which is then recorded on a gas-filled area detector (Siemens Hi-Star).

In a two-phase system, the contrast for SAXS is purely determined by the difference in electron density of the two phases. The absolute scattering cross section per unit volume, $d\Sigma/d\Omega$, is given by the product of a contrast factor K and an interference function S(q)

$$\frac{d\Sigma}{d\Omega} = KS(q).$$

K determines the intensity of the scattered radiation and is proportional to the square of the electron density difference between the two phases, $$K = r_e^2 \Delta \rho_e^2.$$

Here, $r_e$ is the classical electron radius, $2.8 \times 10^{-15}$ m. S(q) is dictated by the shape and spatial arrangement of the phases and determines the angular or q-dependence of the scattered radiation. Table 1 is a tabulation of the electron densities of materials used in the fabrication process.

TABLE 1

Electron Densities of Materials Used in Array Fabrication

| | $\rho_e$ (mole e$^-$/Å$^3$) |
|---|---|
| polystyrene | 0.341 |
| polymethylmethacrylate | 0.386 |
| water | 0.335 |
| methanol/water (20/80) | 0.319 |
| cobalt | 2.456 |

From Table 1 it is clear that replacement of PMMA in the block copolymer with air to form nanocylinders (the electron density of air, $\rho_e$, is essentially 0), and subsequently replacing air with cobalt to form a nanoarray of cobalt, will result in large changes in the electron density of the cylinders and correspondingly large changes in the measured scattered intensity. The morphology of the copolymer under study comprises an ordered array of hexagonally packed cylinders on a surface. The scattering pattern is dominated by the reflections of this 2D-lattice and any change in this structure could be easily observed.

FIGS. 3A to 3F show several scattering patterns taken at different steps during the process of nanowire fabrication. The intensity scale is given in the lower left corner of the images. All measurements were made at an angle of incidence at 45°. In the initial state after spin coating the sample is in a poorly ordered state (as described in Russell, et al., in *Ordering in Macromolecular Systems*, eds. Teramoto, A., Kobayashi, M. & Norisuye, T., 217, Springer-Verlag, Berlin, 1993). Annealing in an electric field led to a well ordered, oriented structure as discussed above.

FIG. 3A shows a scattering pattern measured for a 1 micrometer-thick sample of 70/30 (by volume) PS/PMMA copolymer film on a gold patterned substrate. Two weak reflections on the equator are evident, and show the alignment of the cylindrical microdomains oriented in the electric field normal to the surface. Since the sample is only 1 micron thick and the electron densities of PS and PMMA are similar, the peaks are of comparable intensity to the background arising from air scattering and inhomogeneities in the substrate.

In FIG. 3B, a scattering pattern from the same film is shown, after removal of the PMMA cylinders. Due to the increased contrast after pore formation the scattering intensity is strongly enhanced, while the position of the peaks is unchanged. The intensity has increased by a factor of 54, which is in quantitative agreement with the value calculated from the electron densities, assuming complete removal of the PMMA. In addition the peak position has remained unchanged, demonstrating that the structure has not been altered during pore formation.

Subsequently, the film was rinsed with a solvent that selectively removed the degraded component. After drying, the sample now consisted of a thin, crosslinked film containing cylindrical pores that extend from the surface to the lower electrode interface (FIG. 1D). This forms a scaffold in which nanoscale magnetic cylinders are created.

The final part of the procedure involved filling the template pores with magnetic material by way of electrochemical deposition (electroplating). Since the pores have a high aspect ratio, they are narrow and long, and thus the surface-selective nature of electroplating is an essential factor in being able to selectively fill the pores with metal. In other words, electrochemical reduction will occur only at surfaces in electrical contact with the plating circuit, in this case, the gold at the bottom of each pore. In the electroplating process as shown schematically in FIG. 2, the sample is connected to a wire electrode and put into an aqueous solution containing the magnetic ions to be deposited. A platinum counter-electrode is added to the bath and an appropriate voltage difference is applied to induce electrochemical reduction of the magnetic metal ions. The current is carefully monitored to control the amount of metal deposited inside of the pores and thereby control the height of the resulting magnetic cylinders.

As compared to plating onto an unpatterned film, various new issues play a role, including the constrained ion diffusion down the pores, anti-wetting, and a modified electrochemical double layer. On one hand, each pore is essentially a nanoelectrode, confined to a small diameter, for example, a 14 nm diameter, with ions diffusing down to the electrode surface along the length of the pore. However, because of the high pore density, the ion-diffusion-layer patterns feeding each pore are highly overlapping, i.e. in the "total-overlap" electrochemical response limit. Thus, with respect to the ion concentration in the bulk of the electrolyte solution, the situation described here is electrochemically identical to that of a planar electrode, but with the added "series" diffusion resistance due to the constrained diffusion of ions down the pore. It is important to note that the nanoporous templates used in this work are hydrophobic and exhibit pronounced anti-wetting behavior as discussed below. By adding methanol as a surfactant to the plating solution, the solution was able to wet the interior of the pores in the template and facilitate electrodeposition. The addition of surfactants is a common practice in electroplating, especially when regions of submicron scale, as in the LIGA electroforming process, are involved. Wetting of the pores was verified by SAXS.

FIG. 3C shows the scattering pattern obtained after placing a droplet of a methanol/water mixture (20/80) on the sample, which was then covered by a thin mica sheet. Based on the electron densities the resulting scattering intensity should decrease by a factor of 240. The water/methanol mixture wets the interior of the pores, due to contrast matching the scattering pattern disappears. As seen, the scattering is indistinguishable from background. After drying the sample, the two original peaks appear again.

If the same experiment is performed with pure water, for which the contrast matching should be better, the scattering pattern remains unchanged as shown in FIG. 3D, indicating that water alone cannot penetrate into the pores. Water alone does not wet the interior of the pores, and the scattering pattern remains unchanged. This observation correlates with experiments using pure aqueous plating baths, containing no surfactant, where electrodeposition was found to be unsuccessful.

If methanol is present during the electroplating process, a largely homogeneous cobalt array is deposited. This array is optically-black as would be expected for a particulated metal film of closely-spaced nanoscale cylinders. This is in stark contrast to the shiny, reflective appearance observed for continuous cobalt films made by electrodeposition without using a template.

The scattering patterns obtained from the templated film before and after plating are shown in FIGS. 3E and 3F. Due to the high electron density of cobalt the scattered intensity increases strongly. Again the peak positions remain unchanged. Higher order reflections can be seen indicating the highly ordered structure of the nanowire array. Note the difference between (b) and (e) arises from the change in scale.

These measurements were performed with a Quantum Design MPMS SQUID® magnetometer. Replacing air in the pores with cobalt corresponds to an increase in the intensity by a factor of 39. The measured intensity increases by only half this value, since the pores were approximately half-filled (500 nm height). In fact, the intensity of the scattering serves as a quantitative means of measuring the length of the Co cylinders deposited in the pores. These results show that a height-controlled filling of the pores is possible. The ability to control height, while maintaining the same area density, is relevant to many research applications. In magnetic data storage, for example, elements of sufficiently large aspect ratio are needed to prevent the onset of superparamagnetism such that magnetic stability is maintained at room temperature. SAXS measurements show that the original microstructure is fully retained throughout the entire fabrication process, leading to an ordered array of cobalt cylinders with a density of $1.93 \times 10^{11}$ cylinders per cm$^2$ ($1.25 \times 10^{12}$/in$^2$).

Example 5

Magnetization Properties of Nanocylinder Arrays

Figure 4A:
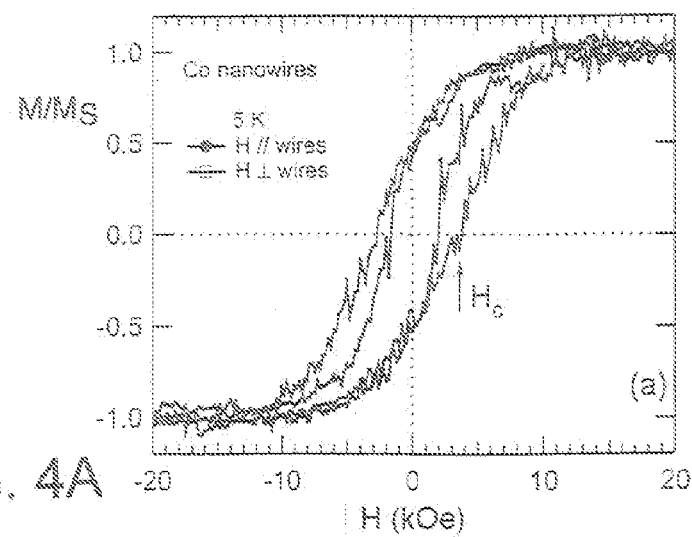
FIG. 4A is a graph showing magnetic hysteresis data at T=5 K of an array of cobalt nanowires.
Figure 4B:
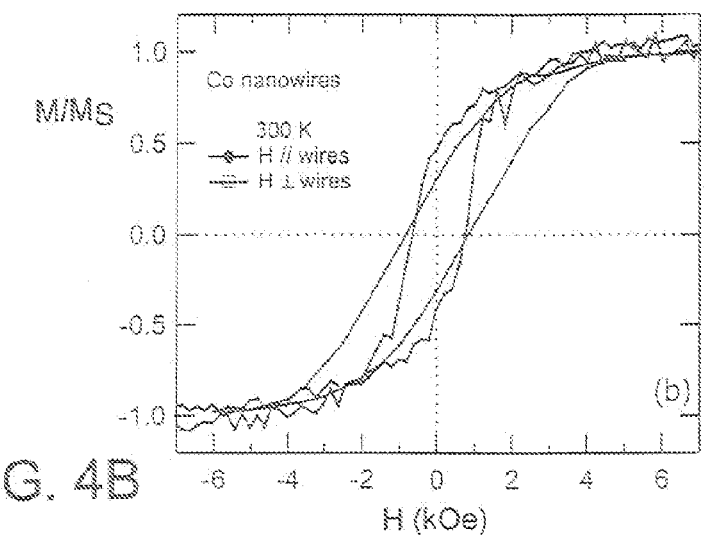
FIG. 4B is a graph showing magnetic hysteresis data at T=300 K of an array of cobalt nanowires.
Figure 4C:
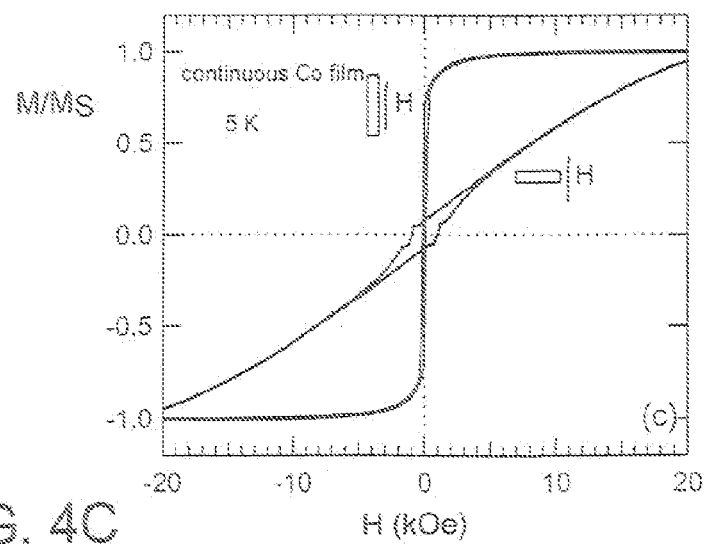
FIG. 4C is a graph showing magnetic hysteresis data at T=5 K of a continuous cobalt film.

FIGS. 4A–4C are graphs showing the magnetization properties of an array of Co nanowires for a sample in which each wire has a 14 nm diameter, 500 nm length, and an aspect ratio of 36. The array period is 24 nm. FIG. 4A shows the magnetic hysteresis at a temperature of 5K, and FIG. 4B shows the magnetic hysteresis at a temperature of 300K. In FIGS. 4A and 4B the curves for the magnetic field parallel to and perpendicular to wire axis are both shown. Each curve was normalized to full saturation. The coercive field is a substantial fraction of the anisotropy field value for cobalt (~7000 G). FIG. 4C shows the magnetic hysteresis for a continuous cobalt film at a temperature of 5K. The electrochemically-grown film is 500 nm thick.

A salient feature in the data in FIGS. 4A and 4B is the notably large coercivity field Hc (3000 Oe at 5 K and 800 Oe at 300 K) for field direction parallel to the wire axis (perpendicular to substrate). This large Hc is to be compared to the behavior of the continuous cobalt film also shown. The regularity of the array is to be noted (by contrast, a randomly positioned nanowire assembly was seen to exhibit a distinct decrease of coercivity below ~50 nm rod diameter, that is, Hc~300 Oe for 30 nm diameter wires at room temperature). The ordered array demonstrated in FIGS. 4A to 4B represent routes to single-domain, ultrahigh-density "perpendicular" magnetic data storage media, while at the same time permitting sufficiently large aspect ratio magnetic nanowires to circumvent the detrimental effects of superparamagnetism (a spontaneous thermal magnetization reversal processes arising from the competition between thermal and magnetic energies at small dimensions). To be a viable candidate for perpendicular media, the system desirably has a sufficiently large coercivity for a magnetic field directed parallel to the cylinders.

FIG. 4C shows a small square loop near the origin for the perpendicular orientation, which originates from a configurational reorientation of the in-plane magnetic domains (as described in Bertotti, G., *Hysteresis in Magnetism*, Academic Press, New York, 1998). In bulk and continuous films, pure cobalt has a coercivity on the order of 10 Oe, considerably smaller than the theoretical anisotropy field of ~7000 Oe, due to the easy nucleation and propagation of magnetic domain walls.

In the magnetic arrays examined here, the wire diameter is considerably smaller than the theoretical critical single-domain diameter (~50 nm), and single domain behavior is possible. However, the close spacing between the wires will lead to a non-negligible dipolar magnetic interaction that substantially modifies the magnetic behavior as compared to an idealized system of noninteracting nanowires. This can be noted as the considerable "in plane" coercivity (parallel to substrate plane and perpendicular to the wire axis) present in the array samples and also the "stretched" hysteresis loop for the field-parallel-to-wire orientation due to non-zero demagnetization effects. The structurally-modified magnetic properties of arrays described herein demonstrate the application of this fabrication technique in engineering the properties of a magnetic material.

OTHER EMBODIMENTS

It is to be understood that while the invention has been described in conjunction with the detailed description thereof, that the foregoing description is intended to illustrate and not limit the scope of the invention, which is defined by the scope of the appended claims. Other aspects, advantages, and modifications are within the scope of the following claims.

What is claimed is:

1. A nanoscale array comprising an electrically-conductive substrate and nanowires arranged in parallel on the substrate, the nanowires each having a diameter of 1.0 to 100 nanometers, and having a periodicity of 1.0 to 100 nanometers; and a polymer matrix between the nanowires, wherein the substrate is a metal substrate.

2. The nanoscale array of claim 1, wherein the nanowires have a diameter of from about 5.0 to about 50 nanometers.

3. The nanoscale array of claim 1, wherein the substrate is gold.

4. The nanoscale array of claim 1, wherein the nanowires comprise a metal.

5. The nanopore array of claim 1, wherein the organic polymer matrix comprises a copolymer.

6. The nanopore array of claim 5, wherein the copolymer is a diblock copolymer.

7. A magnetic array comprising a substrate and an array of nanoscopic cylinders comprising a magnetic material and arranged in parallel on the substrate, and an organic polymer matrix disposed between the cylinders comprising the magnetic material, wherein the substrate is a metal substrate.

8. The magnetic array of claim 7, wherein the cylinders each have a diameter of about 1.0 to about 100 nanometers.

9. The magnetic array of claim 7, wherein the cylinders have a periodicity of from about 1.0 to about 100 nanometers.

10. The magnetic array of claim 7, wherein the cylinders have a diameter of about 5.0 to about 50 nanometers.

11. The magnetic array of claim 7, wherein the substrate is gold.

12. The magnetic array of claim 7, wherein the magnetic material is cobalt or copper.

13. The magnetic array of claim 7, wherein the magnetic material comprises alternating layers of a magnetic metal and a non-magnetic material.

14. A magnetic storage medium comprising the magnetic array of claim 7.

15. A magnetoresistance device comprising the array of claim 7.

16. The nanopore array of claim 7, wherein the organic polymer matrix comprises a copolymer.

17. The nanopore array of claim 16, wherein the copolymer is a diblock copolymer.

18. A magnetic array comprising a substrate and an array of nanoscopic cylinders comprising a magnetic material and arranged in parallel on the substrate, wherein the substrate is a gold substrate.

* * * * *